(12) United States Patent  
Walling et al.

(10) Patent No.: US 10,797,773 B2  
(45) Date of Patent: Oct. 6, 2020

(54) APPARATUSES AND METHODS FOR TRANSMISSION BEAMFORMING

(71) Applicant: UNIVERSITY OF UTAH RESEARCH FOUNDATION, Salt Lake City, UT (US)

(72) Inventors: Jeffrey Walling, Salt Lake City, UT (US); Wen Yuan, Salt Lake City, UT (US); Zhidong Bai, Salt Lake City, UT (US); Ali Azam, Salt Lake City, UT (US)

(73) Assignee: UNIVERSITY OF UTAH RESEARCH FOUNDATION, Salt Lake City, UT (US)

( * ) Notice: Subject to any disclaimer, the term of this patent is extended or adjusted under 35 U.S.C. 154(b) by 0 days.

(21) Appl. No.: 16/789,098

(22) Filed: Feb. 12, 2020

(65) Prior Publication Data

US 2020/0259540 A1 Aug. 13, 2020

Related U.S. Application Data

(60) Provisional application No. 62/804,876, filed on Feb. 13, 2019.

(51) Int. Cl.
*H04L 25/03* (2006.01)
*H04B 7/06* (2006.01)
(Continued)

(52) U.S. Cl.
CPC ............ *H04B 7/0617* (2013.01); *H03F 1/56* (2013.01); *H03F 3/005* (2013.01); *H03F 3/245* (2013.01);
(Continued)

(58) Field of Classification Search
CPC ......... H04B 7/0617; H03F 1/56; H03F 3/005; H03F 3/245; H03F 2200/387; H03F 2200/451; H03K 3/0315
(Continued)

(56) References Cited

U.S. PATENT DOCUMENTS 5,027,126 A 6/1991 Basehgi et al.
7,433,713 B2 10/2008 Haskell et al.
(Continued)

FOREIGN PATENT DOCUMENTS

WO 2018132006 A1 7/2018

OTHER PUBLICATIONS

Zhidong Bai et al., "A Split-array, C-2C Switched-Capacitor Power Amplifier in 65nm CMOS", IEEE Radio Frequency Integrated Circuit Symposium, 2017, pp. 336-339.*

(Continued)

*Primary Examiner* — Tesfaldet Bocure
(74) *Attorney, Agent, or Firm* — Dorsey & Whitney LLP

(57) ABSTRACT

Embodiments of the disclosure are drawn to apparatuses and methods for transmission beamforming. A multiphase beam steering transmitter may include a transmitter array of multiple transmitters. A transmitter may include a multiphase logic decoder that directly controls a power amplifier to perform a vector addition of a beam phase and amplitude. A transmitter of the array may include a multiphase clock generator that outputs basis phases with embedded phase modulation data which are output to the multiphase logic decoder. The multiphase clock generator may receive a modulated clock signal. The PA may be a multiphase switched capacitor power amplifier. The multiphase logic decoder may output two phases adjacent to a desired phase as inputs to clocks of the SCPA. The multiphase logic
(Continued)

decoder may further output a control signal that determines which cells in the SCPA are activated and when.

20 Claims, 10 Drawing Sheets

(51) Int. Cl.
*H03F 3/24* (2006.01)
*H03F 3/00* (2006.01)
*H03K 3/03* (2006.01)
*H03F 1/56* (2006.01)
*H04L 27/00* (2006.01)

(52) U.S. Cl.
CPC ..... *H03K 3/0315* (2013.01); *H03F 2200/387* (2013.01); *H03F 2200/451* (2013.01)

(58) Field of Classification Search
USPC .................................. 375/267, 299; 455/101
See application file for complete search history.

(56) References Cited

U.S. PATENT DOCUMENTS

| | | | |
|---|---|---|---|
| 8,457,567 | B2 | 6/2013 | Ryter |
| 9,020,027 | B2 | 4/2015 | Staszewski et al. |
| 9,137,084 | B2 | 9/2015 | Degani et al. |
| 9,167,345 | B2 | 10/2015 | Ma |
| 9,800,452 | B2 | 10/2017 | Lehtinen |
| 10,658,979 | B2 * | 5/2020 | Gomez ............... H03F 3/45183 |
| 2016/0118716 | A1 * | 4/2016 | Stephenne ............ H04B 17/00 342/372 |
| 2018/0115282 | A1 * | 4/2018 | Thyagarajan ......... H03F 1/0277 |

OTHER PUBLICATIONS

Zhidong Bai et al., "A Multiphase Interpolating Digital Power Amplifier for TX Beamforming in 65nm CMOS", IEEE Internation Solid-State Circuit Conference, Feb. 18, 2019, pp. 78-80.*
U.S. Appl. No. 62/804,876, filed Feb. 13, 2019.
Bai, et al., "Multiphase Interpolating Digital Power Amplifiers for TX Beamforming", 2018, 12.
Chowdhury, et al., "An Efficient Mixed-Signal 2.4-GHz Polar Power Amplifier in 65-nm CMOS Technology", IEEE Journal of Solid-State Circuits, vol. 46, No. 8, Aug. 2011, pp. 1796-1809.
Fulde, et al., "A Digital Multimode Polar Transmitter Supporting 40MHz LTE Carrier Aggregation in 28nm CMOS", IEEE ISSCC Dig. Tech. Papers, pp. 218-219.
Qian, et al., "A 3-7GHz 4-Element Digital Modulated Polar Phase-Array Transmitter with 0.35° Phase Resolution and 38.2% Peak System Efficiency", Proc. of the IEEE Custom Integrated Circuits Conference, 2017, pp. 1-4.
Soer, et al., "1.0-to-4.0GHz 65 nm CMOS Four-Element Beamforming Receiver Using a Switched-Capacitor Vector Modulator with Approximate Sine Weighting via Charge Redistrubution", Digest of Technical Papers, IEEE International Solid-State Circuits Conference, 2011, pp. 63-65.
Soer, et al., "Spatial Interferer Rejection in a Four-Element Beamforming Receiver Front-End with a Switched-Capacitor Vector Modulator", IEEE Journal of Solid-State Circuits, vol. 46, No. 12, Dec. 2011, pp. 2933-2942.
Wang, et al., "3-to-5GHz 4-Channel UWB Beamforming Transmitter with 1° Phase Resolution Through Calibrated Vernier Delay Line in 013pm CMOS", IEEE ISSCC Dig. Tech. Papers, 2012, pp. 444-446.
Yuan, et al., "A Multiphase Switched Capacitor Power Amplifier", IEEE J Solid-State Circuits, vol. 52, May 2017, pp. 1320-1330.
Zheng, et al., "A 0.19mm² 128mW 0.8-1.2GHz 2-Beam 8-Element Digital Direct to RF Beamforming Transmitter in 40nm CMOS", Proc. of the IEEE RFIC Symposium, 2018, pp. 128-131.

* cited by examiner

APPARATUSES AND METHODS FOR TRANSMISSION BEAMFORMING

RELATED APPLICATION(S)

This application claims priority to U.S. Provisional Application No. 62/804,876 filed on Feb. 13, 2019 the contents of which are incorporated herein by reference for any purpose.

NOTICE

This invention was made with government support under Grant Number 1508701 awarded by the National Science Foundation. The government has certain rights in the invention.

BACKGROUND

This disclosure relates generally to beamforming. More specifically, this disclosure relates to transmission beamforming with multiple transmitters. As used herein, the abbreviation TX refers to transmission and/or transmitters. Future 5G communications will heavily leverage beamforming and MIMO (multiple-in-multiple-out) techniques, owing to the improvement in data transmission capacity. In a transmit (TX) beamformer, the phase and amplitude of an array of Txs can be arbitrarily adjusted to spatially steer a transmitted beam toward a user, or multiple users. The amplitude and direction of the beam is adjusted by controlling the gain and phase of each TX in the array. Gain is typically adjusted with a variable gain amplifier in the driver chain. Four primary means to control the output beam angle have been leveraged: passive radio frequency (RF) phase shifting, local oscillator (LO) phase shifting, digitally controlled delay lines, and quadradure modulation. Passive RF phase shifting is bulky and lossy, owing to high losses in the passive elements and it is difficult to provide phase control through 360°. LO phase shifting often use a single passive phase shifter, or a multiphase ring oscillator; these typically provide lower phase resolution. Digitally controlled delay lines provide a wider bandwidth response but suffer from reduced phase resolution as frequency is increased and can consume high power. Digital phase shifting techniques have recently shown promise in polar systems, but the quadrature modulator typically used for phase shifting incurs high loss if placed directly at the output stage.

SUMMARY

A transmit (TX) beamformer may be used to steer a transmitted beam in a desired direction (e.g., toward a user or multiple users). The TX beamformer may include an array of transmitters (TX). The amplitude and direction of the beam are adjusted by controlling the gain and phase of each TX in the array of TX.

According to embodiments of the disclosure, a multiphase beam steering transmitter (MBSTX) may include a power amplifier (PA) directly controlled by a multiphase controller (MC). The multiphase controller may include a multiphase clock generator and a multiphase logic decoder. The multiphase logic decoder may provide control signals to the PA to control an output signal of the PA. The MBSTX may perform a vector addition of the beam phase and amplitude. This may allow for higher phase and gain resolution with lower losses compared to existing solutions.

In some embodiments, an array of TX includes four TX, but the array may include more or fewer TX. Each TX in the array may include a multiphase clock generator, a multiphase logic decoder, and a multiphase switched capacitor power amplifier. In some embodiments, each TX may include a radio frequency (RF) matching network for coupling to an antenna.

The multiphase clock generator of each TX may receive a clock signal, which may be a modulated RF clock signal in some embodiments. The multiphase clock generator may include a multiphase ring oscillator in some embodiments. The multiphase clock generator may output a set of basis phases ($\phi 0$-$\phi N$) that are provided to a multiphase logic decoder. The basis phases may include embedded phase modulation data.

In addition to the set of basis phases, the multiphase logic decoder may receive a digital input code (Bin) from a digital pattern generator. The input code may indicate the desired output beam angle. Based on the desired output angle, the multiphase logic decoder selects two adjacent phases to the desired output beam angle (e.g., $\phi A$, $\phi B$), and these two adjacent phases are provided to the multiphase SCPA as clock inputs.

The input code Bin may further include a control bit. The control bit may indicate an enabled state and a disabled state. When the control bit is enabled, the amplitude and phase-weighting for a desired beam output are calculated and stored. When the control bit is disabled, the calculated amplitude and phase weighting are added to the stored beam output code. The multiphase logic generator outputs an amplitude code (AMP) that selects whether to clock each cell in the SCPA on the first or second of the selected phases (e.g., $\phi A$ or $\phi B$) or held to ground. Thus, the phase/amplitude/beam weighting may be combined in a single digital encoder block.

In some embodiments, a method of beamforming (e.g., steering) may be performed. First, a multiphase clock generator may generate a plurality of output phases. In some embodiments, the output phases may be equally spaced. In some embodiments, the output phases may be generated from a modulated clock signal, which may allow the output phases to include embedded phase modulation data. The output phases may be used as inputs to a clock selection multiplexer (MUX) tree. In some embodiments, the MUX tree may be included in a multiphase logic decoder. A desired output phase of a beam may be provided to the MUX tree as a phase selection code. In some embodiments, the phase selection code is a word (e.g., an 8 bit word with a 1 bit control bit). The MUX tree selects two phases from the received output phases that are adjacent to the desired output phase. This may provide a course phase shift.

An envelope code embedded with both envelope modulation and beam weighting may be provided to the multiphase logic decoder along with the phase selection code. The envelope code and phase selection code may be used to generate Bin in some embodiments. The envelope code may be a word (e.g., an 8b word with a 1b control bit) in some embodiments. In some embodiments, the envelope code may be based, at least in part, on the embedded phase modulation included in the output phases of the multiphase clock generator. Based on the envelope code and the phase selection code, the multiphase logic decoder may select the number of cells in a multiphase SCPA that will switch on each phase of selected clocks. This may provide phase interpolation for a fine phase shift.

BRIEF DESCRIPTION OF THE DRAWINGS

FIG. 5 is a circuit diagram of a unary logic and driver of the SAMP-SCPA shown in

FIG. 4.

DETAILED DESCRIPTION

The following description of certain embodiments is merely exemplary in nature and is in no way intended to limit the scope of the disclosure or its applications or uses. In the following detailed description of embodiments of the present apparatuses, systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed apparatuses, systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Embodiments of the present disclosure include beamforming transmitters (e.g., transmit beamformers) utilizing multiphase beamforming, including multiphase interpolation beamforming. The beamforming transmitters may allow for simultaneous frequency translation, digital-to-analog conversion, and/or front-end power amplification in some embodiments. In some embodiments, the beamforming transmitters may include split-array multiphase (SAMP) switched-capacitor power amplifiers (SCPA). In some embodiments, the beamforming transmitters may allow for high resolution complex beamweighting. In some embodiments, beamweighting may be achieved by leveraging control of clocking edges and/or control of the ratioed capacitance of a capacitor array of the SCPA.

In some embodiments, a SAMP-SCPA may output any desired amplitude and/or phase, at a rate of operation of the SAMP-SCPA's decoder(s). In some applications, multiphase signaling may not inherent bandwidth limitations that polar signaling does. In some embodiments, an SCPA may be more linear than current-mode digital power amplifiers (DPAs), which may be due, at least in part, to the use of ratioed capacitors. Furthermore, in some embodiments, the SCPA may allow for an embedded output-stage/power amplifier that may operate linearly at low power and/or at powers exceeding 1 W.

Figure 1:
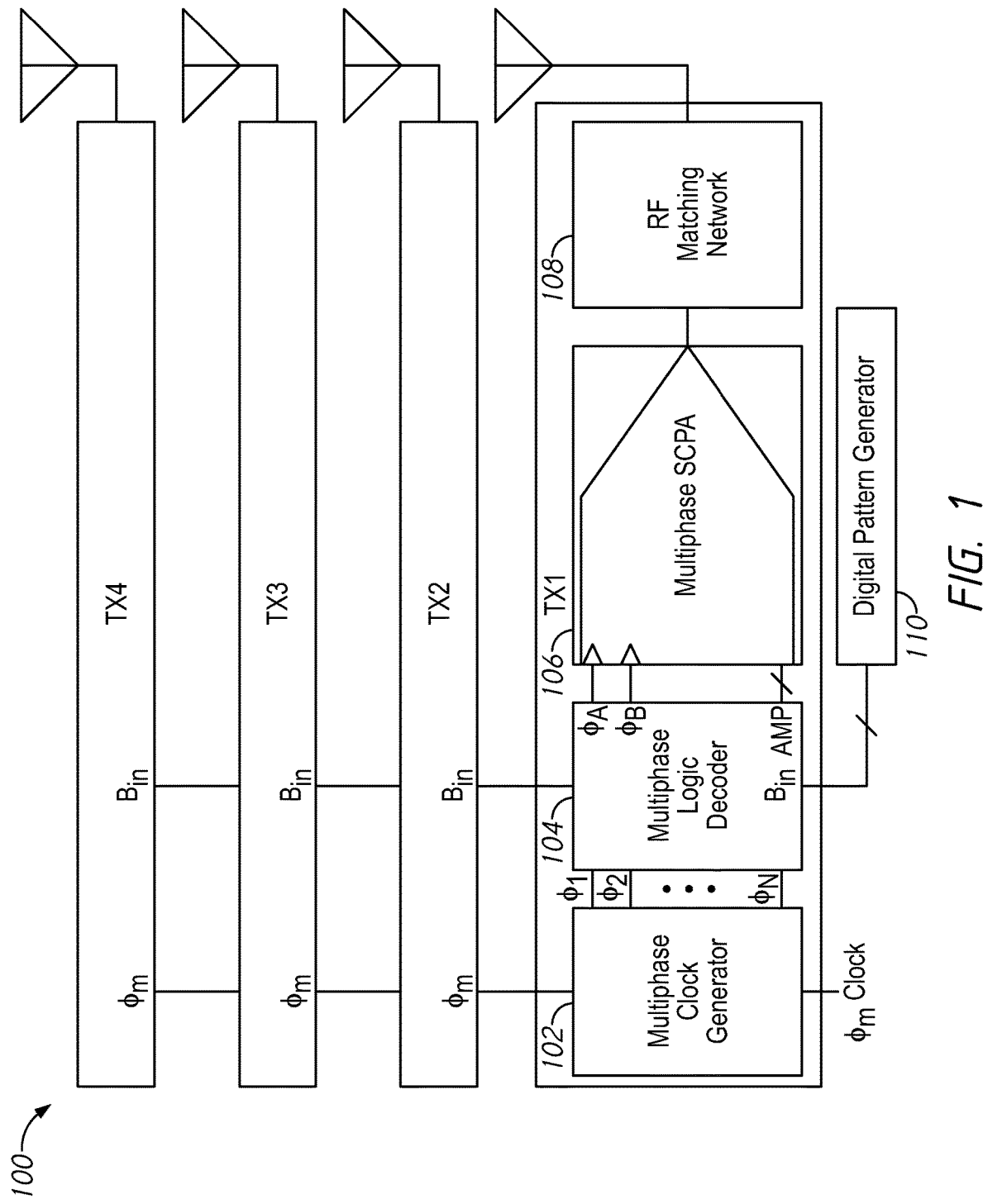
FIG. 1 is a block diagram of a multiphase beamforming transmitter system according to an embodiment of the disclosure.

FIG. 1 is a block diagram of a multiphase beamforming transmitter system 100 according to a first embodiment of the disclosure. In the embodiment shown in FIG. 1, system 100 includes four transmitters (TX1-4), however, system 100 may include more or fewer transmitters. Each transmitter TX1-4 may include a multiphase clock generator 102, a multiphase logic decoder 104, a multiphase switched-capacitor power amplifier (SCPA) 106, and a radio frequency (RF) matching network 108. The internal components of the transmitters TX1-4 is only illustrated for TX1. In the system 100, a phase modulated RF clock signal ($\phi_m$ Clock) is input to the array of transmitters TX1-4 to the multiphase clock generator 102. The multiphase clock generator 102 may include a multiphase ring oscillator (not shown). $\phi_m$ Clock may injection lock the multiphase ring oscillator, causing the multiphase clock generator 102 to output a set of basis phases ($\phi 1$-$\phi N$) that have embedded phase modulation data from the input. The basic phases $\phi 1$-$\phi N$ may be output to the multiphase logic decoder (MLD) 104.

Instead of only applying digital phase shifting, the system 100 may combine both amplitude weighting and phase shifting in a single digital encoder block. A digital input code ($B_{in}$) provided by a digital pattern generator 110 may drive the MLD 104. $B_{in}$ may cause the MLD 104 to select two adjacent phases ($\phi A$, $\phi B$) to a desired output beam angle. The desired output beam angle may be based, at least in part, on a location of a desired recipient of a transmission of the system 100. The MLD 104 may provide these two phases $\phi A$, $\phi B$ as the clock inputs to the multiphase switched capacitor power amplifier (MP-SCPA) 106. When a control bit of $B_{in}$ is enabled, a amplitude- and phase-weighing for a desired beam output are calculated and stored. When the control bit of $B_{in}$ is disabled, a modulation is added to a stored beam output code. In some embodiments, the most significant bit (MSB) may be the control bit. The MLD 104 outputs an amplitude code (AMP) that may select whether to clock each cell in the SCPA on $\phi A$ or $\phi B$, or hold the cell at ground. This operation may combine phase-amplitude-modulation and beam weighting in a single digital encoder block.

Figure 2:
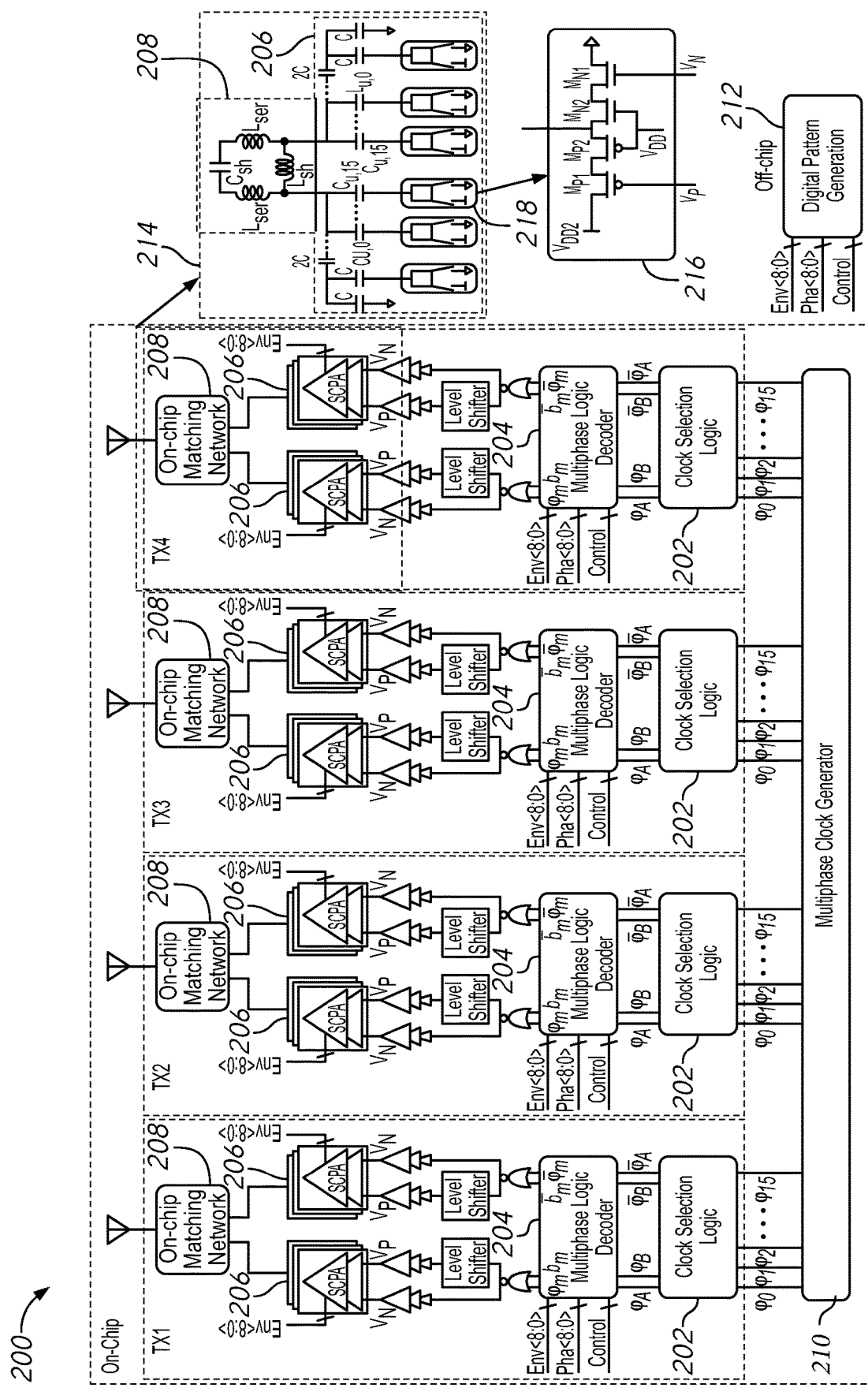
FIG. 2 is a schematic diagram of a multi-element beamforming transmitter according to a first embodiment of the disclosure.

FIG. 2 is a schematic diagram of a multi-element beamforming transmitter 200 according to the first embodiment of the disclosure. In some embodiments, the multi-element beamforming transmitter 200 may included in the system 100 in FIG. 1. In the embodiment shown in FIG. 2, the multi-element beamforming transmitter 200 includes four transmitters (e.g., channels) TX1-4. However, the multi-element beamforming transmitter 200 may include any number of transmitters. Each transmitter TX1-4 may include a clock selection logic 202, a multiphase logic decoder 204, a multiphase switched capacitor power amplifier (SCPA) 206, and a radio frequency (RF) matching network 208. The transmitters TX1-4 may share a common multiphase clock generator 210 in some embodiments. The transmitters TX1-4 and the multiphase clock generator 210 may be included on-chip in some embodiments. The multi-element beamforming transmitter 200 may further include a digital pattern generation circuit 212. In some embodiments, the digital pattern generation circuit 212 may be included off-chip. The MP-SCPA 208 may have high linearity, compact size, and/or the ability to output moderate-to-high output power. In some embodiments, each MP-SCPA 208 may include a local multiphase ring oscillator, injection locked to the common multiphase clock generator 210. The clock signal may be input to the chip via an LVDS clock RX in some embodiments. The clock may be routed such that the clock has equal delay to each ring oscillator to provide common time/phase basis in some embodiments.

Block 214 shows a circuit diagram of the on-chip matching network 208 and the MP-SCPA 206 according to an embodiment of the disclosure. The matching network 208 may include one or more inductors and one or more capacitors. The MP-SCPA 206 may include an array of capacitors coupled to a plurality of switches. Block 216 shows a circuit diagram of a switch 218 of the MP-SCPA 206. Switch 218 may include one or more transistors, such as MOSFET transistors.

The weighting for beamforming may be performed as follows. The multiphase clock generator 210, which may be a local, injection locked multiphase clock in some embodiments, may generate equally spaced output phases $\phi 0$-$\phi 15$ (e.g., sixteen in the example shown in FIG. 2) that are input to a clock selection logic 202. In some embodiments, clock selection logic 202 may include a multiplexer (MUX) tree (not shown). The desired output phase is input to the chip via a nine bit (9b) control word (control). The MUX tree selects the two phases ($\phi A$, $\phi B$) adjacent to the desired output phase. These two phases may provide a course phase shift based on the two selected phases $\phi A$, $\phi B$. The next stage of the multiphase logic decoder 204 then receives the 9b phase selection code (Pha<8:0>) and a 9b envelope code (Env<8:0>) that is embedded with both the envelope modulation and beam weighting. The MLD 204 selects a number of cells in the MP-SCPA 206 that will switch on each phase of the selected clocks and provides phase interpolation for fine phase shift.

The MP-SCPA 208 may provide a linear output response. Polar and multiphase combinations on the array may be native, by controlling the clock phase and may not suffer the non-linearities that current steering phase shifting mechanisms can create. Finally, the multiphase technique described herein may not suffer from −3 dB output power reduction that quadrature combination incurs, which may allow high efficiency operation directly at the output stage in some embodiments.

Figure 3:
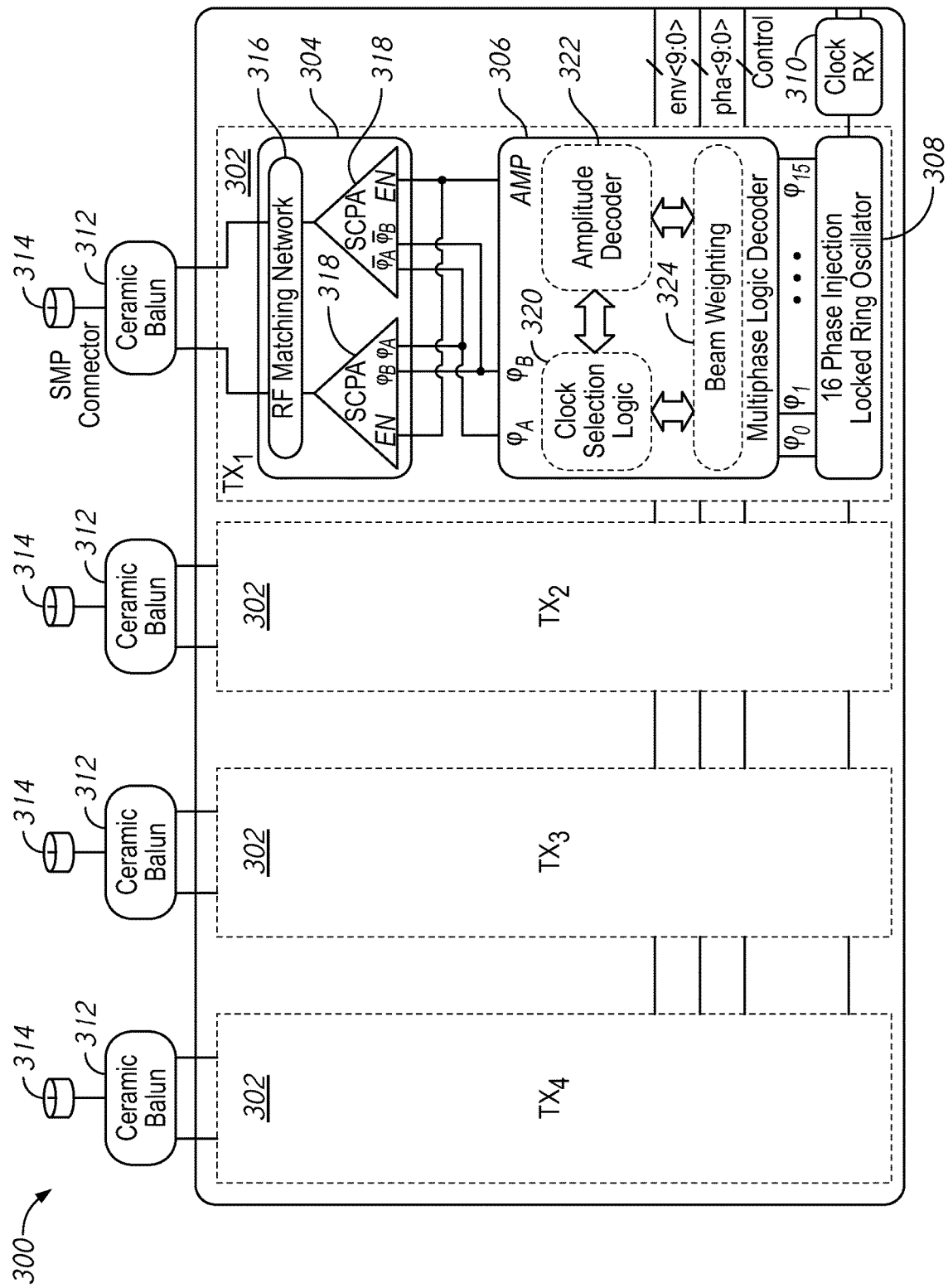
FIG. 3 is a schematic diagram of a multi-element beamforming transmitter according to a second embodiment of the disclosure.

FIG. 3 is a schematic diagram of a multi-element beamforming transmitter 300 according to a second embodiment of the disclosure. In some embodiments, the multi-element beamforming transmitter 300 may be included in multiphase beamforming transmitter system 100. In some embodiments, at least some of the elements described in reference to the first embodiment shown in FIG. 2 may be used to implement at least some of the elements of the second embodiment. In some embodiments, at least some of the elements described in reference to the second embodiment may be used to implement at least some of the elements of the first embodiment.

The multi-element beamforming transmitter 300 may include multiple transmitters 302 $TX_{1\text{-}4}$. Although four transmitters 302 are shown, the beamforming transmitter 300 may include more or fewer transmitters 302 in other embodiments. The internal components of the transmitters $TX_{1\text{-}4}$ is only illustrated for $TX_1$. Each transmitter 302 may include a SAMP-SCPA core 304, a multiphase logic decoder 306, and a phase injection locked ring oscillator 308.

In some embodiments, the phase injection locked ring oscillator 308 may receive a clock signal from a global clock circuit 310. The phase injection locked ring oscillator 308 may generate a multiphase clock signal ($\phi_{0\text{-}15}$) based, at least in part, on the clock signal received from the global clock circuit 310. In some embodiments, the global clock circuit 310 may be a low voltage differential signaling clock. In some embodiments, the phase injection locked ring oscillator 308 may be an 8-stage pseudo differential ring oscillator which may generate sixteen evenly spaced basis phases. In some embodiments, multiphase clock signal may be generated by other techniques other than phase injection locked ring oscillation, for example, a multi-stage ring oscillator, a multiphase delay locked loop (DLL), and/or a polyphase RC filter.

The multiphase clock signal may be provided to the multiphase logic decoder 306. The multiphase logic decoder 306 may include a beamweighting circuit 324, a clock selection logic circuit 320, and an amplitude decoder 322. The multiphase logic decoder 306 may receive an envelope signal env<9:0> that may include both envelope modulation and beam weighting information for a signal to be transmitted. The multiphase logic decoder 306 may further receive a phase signal pha<9:0> that may include phase information for the signal to be transmitted (e.g., desired output phase). In some embodiments, env and pha may be digital signals (e.g., digital codes). In some embodiments, the multiphase logic decoder 306 may receive a control signal, which may enable/disable separate beamweighting and modulation by each transmitter 302. In some embodiments, the control signal is a one bit signal.

When the control signal is enabled, beamweighting and steering may be performed in two steps. First, the clock selection logic circuit 320 may select from the multiphase clock signal two phases ($\phi_A$, $\phi_B$) that are adjacent to the desired output phase indicated by pha. In some embodiments, the clock selection logic circuit 320 includes a multiplexer tree (not shown), which receives all of the phases of the multiphase clock signal from the phase injection locked ring oscillator 308. In some embodiments, the clock selection logic circuit 320 includes 4 input bits from pha to select the two adjacent phases. At this step, a course phase shift may have been achieved, given that the output phase must be between the two adjacent phases $\phi_A$, $\phi_B$ that are selected by the clock selection logic circuit 320. In the second step, the beam weighting circuit 324 and the amplitude decoder 322 may use pha an/or env to find weights $n_1$ and $n_2$ for the adjacent phases $\phi_A$, $\phi_B$, respectively. In some embodiments, the phase code and the envelope code may each be 16 bit codes. In some embodiments, the phase code and the envelope code may be 8 bits each and are used to form a 16 bit digital code. At this step, a fine beam weight and phase shift may be achieved. More details on finding weights $n_1$ and $n_2$ are described in reference to FIGS. 8-10. In other words, $n_1$ and $n_2$ may provide both fine phase information and amplitude information. The selected phases ($\phi_A$, $\phi_B$) and amplitude AMP are provided from the multiphase logic decoder 306 to the SAMP-SCPA core 304.

When the control signal is disabled, a prior weight and phase shift, such as the weight and phase shift found as described above, are stored as the desired spatial weighting for the beam to be formed. The amplitude and phase input may be added to the stored beam weighting, which may result in computation of new values for $n_1$ and $n_2$ and selection of new phases for a vector output where the output amplitude may be a product of the modulation envelope with a desired beam weight and an output phase may be the sum of the beam phase and modulation phase. An example of which may be seen in FIG. 6.

In some embodiments, the multiphase logic decoder 306 may include cascaded binary-to-thermometer decoders (not shown) to find the weights $n_1$ and $n_2$. The first binary-to-thermometer decoder may select how many capacitors of the SAMP-SCPA core 304 are switched by phase $\phi_A$. The second binary-to-thermometer decoder may select whether the balance of capacitors of the SAMP-SCPA core 304 are switched by phase $\phi_B$ or held at ground.

The SAMP-SCPA core 304 may include one or more SCPAs 318. The SCPA 318 may reconstruct the original signal. The SCPA 318 may be operated as a power digital-to-analog converter (DAC). The reconstructed signal may be provided to a radio frequency (RF) matching network 316, which may couple the transmitter 302 to a load, such as an antenna (not shown in FIG. 3).

In some embodiments, each of the transmitters 302 may be coupled to a ceramic balun 312, which may be coupled to a sub-miniature push-on (SMP) connector 314. In some embodiments, the ceramic balun 312 may be used to convert a differential signal from the transmitter 302 into a single-ended signal. However, the ceramic balun 312 may be omitted in embodiments, for example, when the transmitter 302 provides a single-ended signal. In other embodiments, a non-ceramic balun may be used in place of ceramic balun 312. In some embodiments, the SMP connector 314 may couple the transmitter 302 to an antenna. However, in other embodiments, another connector type may be used to couple the ceramic balun 312 and/or transmitter 302 to an antenna.

The operation of the multiphase logic decoder 306 and design of the SAMP-SCPA core 304 will now be discuss in additional detail with reference to the following figures. However, some or all of the discussion provided may also apply to the multiphase logic decoder 104, the multiphase SCPA 106, and/or RF matching network 108 in some embodiments.

Figure 4:
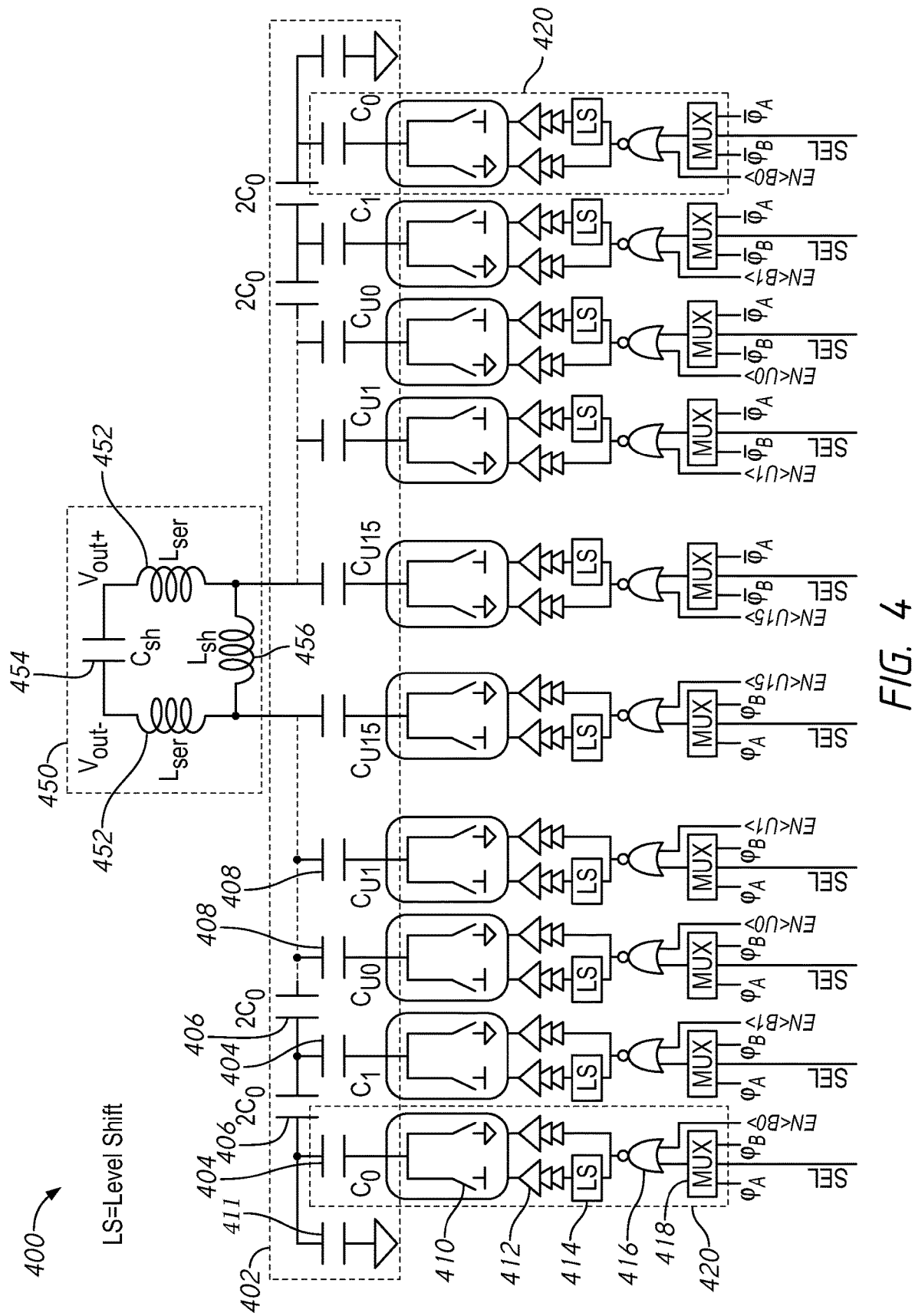
FIG. 4 is a circuit diagram of a differential split-array (SA) MP-SCPA according to an embodiment of the present disclosure.

FIG. 4 is a circuit diagram of a differential split-array (SA) MP-SCPA 400 according to an embodiment of the present disclosure. For context, a matching network 450 is also shown. In some embodiments, the SAMP-SCPA 400 may be included one of the SCPAs 318 or the SAMP-SCPA 400 may be used to implement multiple SCPAs 318. In some embodiments, matching network 450 may be included in RF matching network 316. The SAMP-SCPA 400 is a differential SAMP-SCPA, and one or more components may be duplicated for both portions of the differential signal. For brevity, these components will only be described once.

The SAMP-SCPA 400 may include a capacitor array 402. The capacitor array 402 may include a C-2C portion and a unary portion. The C-2C portion includes binary capacitors ($C_0$, $C_1$) 404 and capacitors 406. The unary portion includes capacitors ($C_{U0-15}$) 408. In some embodiments, the binary capacitors 404 may receive the least significant bits (LSB) of the signal to be transmitted and the unary capacitors 408 may receive the most significant bits (MSB) of the signal to be transmitted. Although as shown in FIG. 4, the capacitor array 402 includes two binary capacitors 404 and sixteen unary capacitors 408, in other embodiments, the capacitor array 402 may include different numbers of capacitors in the C-2C portion and the unary portion. In some embodiments, the unary capacitors 408 may be identical or nearly identical to one another. In some embodiments, the delay of the C-2C capacitors 404, 406 may match the delay of the unary capacitors 408. In some embodiments, each of the C-2C capacitors 404, 406 may drive a slightly different impedance. In some embodiments, matching capacitors 411 may be included.

In some embodiments, in the unary MSB sub-array ($C_{U0-15}$), all the unit capacitors 408 in each slice 420 may be identical, so the size for every switch 410 in the unary MSB path may be identical. While in C-2C LSB sub-array ($C_0$, $C_1$), the total equivalent input capacitance for each successive bit in a C-2C array may increase linearly as the number of C-2C bits are increased. Also, in some embodiments, the nodal parasitic cannot be ignored when considering the total equivalent capacitance in some applications. Hence, in some embodiments, the size of the transistor in the switch 410 and driver chains 412 in the C-2C LSB slices 420 may be designed so that the delay is matched to that of the unary slices 420.

In some embodiments, the capacitors 404, 408 of the capacitor array 402 may be arrayed so that the output of the switch 410 pairs with the top plate of the capacitor 404, 408, which may minimizes exposure of this node to a substrate in some applications. In some embodiments, the bottom plates of every capacitor slice 420 in the array 402 may be shared. In the example shown in FIG. 4, the array 402 is sub-divided into a 12 bit C-2C LSB sub-array and 4 bit unary MSB sub-array. The choice of array resolution may be based, at least in part, on the signal fidelity requirements and/or layout area. For example, for every additional unary bit, the number of capacitors doubles, whereas an additional binary bit only increases the number of capacitors by one. In some applications, signal fidelity requirements may be met using 9-10 bit of array resolution. The choice of where to sub-divide the array 402 may depend at least in part, on the desired linearity and/or complexity of a thermometer decoder (not shown).

In some embodiments, the SAMP-SCPA 400 may be designed as individual slices 420 that may be tiled adjacent to one another. The input signals to each slice 420 may include two clock signals ($\phi A$, $\phi_B$) with identical frequency and a phase separation equal to 360°/M, a phase selection control (SEL) that determines whether to switch on the leading or lagging phase, and an enable bit (EN) that enables/disables switching on the selected phase. In some embodiments, the signals may be received from a multiphase logic decoder, such as multiphase logic decoder 306. In some embodiments, the enable bit EN may be based on the amplitude signal AMP (see FIG. 3) provided by the multiphase logic decoder.

The clock signals $\phi_A$, $\phi_B$ may be provided to a multiplexer (MUX) 418. In some embodiments, the MUX 418 may be a static MUX. The output of the MUX 418 may be controlled by SEL. For example, when the SEL signal is in a first state, the MUX 418 may output the clock signal $\phi_A$ and when the SEL signal is in a second state, the MUX 418 may output the clock signal $\phi_B$. The output of the MUX 418 may be provided to an input of a NOR logic circuit 416. The NOR logic circuit 416 may receive the EN signal as another input. In some embodiments, when EN is low, the clock signal propagates to a driver chain 412 and level shifter 414. When EN is high, the clock signal is blocked from the driver chain 412 and level shifter 414. In some applications, this may save power as the driver chain 412 in each slice 420 may not consume power when the slice 420 is disabled. This may also close the output switch to ground, which may help the SAMP-SCPA to present a constant impedance to a load.

The driver chains 412 and level shifters 414 of each slice 420 may drive a switch 410 (e.g., turn the switch 410 on and off) of the slice 420 based on the control signals provided by the NOR logic circuit 416. More details of the driver chain 412 and switch 410 are provided in FIGS. 5-6. The switch 410 may selectively active and deactivate a corresponding capacitor (e.g., capacitors 404, 408) of the slice 420. Activating and deactivating the capacitor may include coupling and decoupling the capacitor to a voltage source. The selective activating and deactivating the capacitors 404, 408 may generate an output signal output by the SMP-SCPA 400.

In some embodiments, the total capacitance in the array 402 seen by the matching network 450 may remain constant, regardless of the input code (e.g., the signals provided to control the switches 410). This may be due, at least in part, to when a capacitor 404, 408 is disabled, it holds the top place of the capacitor at a constant potential through a fixed value resistance such that the impedance seen looking into each slice 420 of the array 402 is constant. Hence, the matching network 450 may be unchanged for any choice of input code. In some embodiments, the matching network 450 may include a shunt inductor 456, a series inductor 452, and a shunt capacitor 454. In some embodiments, the matching network 450 may form a bandpass network that presents a load with a resistance $R_{opt}$ to the array 402 that is series resonant with the total capacitance of the array 402.

Figure 5:
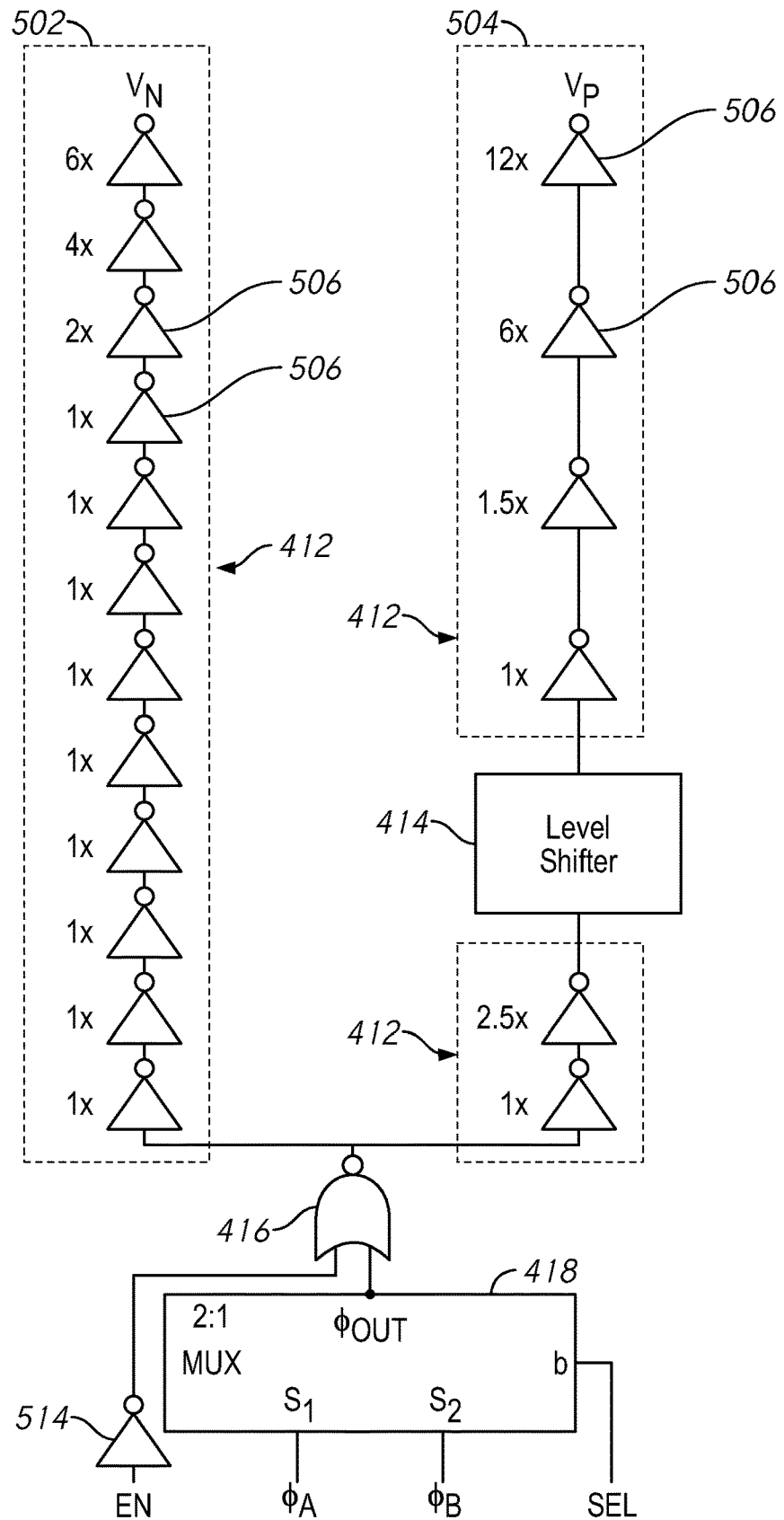

FIG. 5 is a circuit diagram of a unary logic and driver of the SAMP-SCPA shown in FIG. 4. In some embodiments, the driver chain 412 may include two parallel inverter chains 502, 504, each including multiple inverters 506. The inverter chains 502, 504 may be used to drive the switch 410. In some embodiments, the driver chain 412 may be located adjacent to the switch 410. As noted previously, the driver chain 412 receives its inputs from the multiphase logic decoder via the NOR logic circuit 416 and MUX 418. In some embodiments, the outputs of the multiphase logic decoder may be pitch-matched. In some embodiments, co-location of the driver chain 412 and logic may reduce parasitic routing capacitance and/or permit easier timing synchronization of switching signals.

In inverter chain 504, the level shifter 414 may be used to convert the input logic level from one voltage level to another. For example, the level shifter 414 may convert a reference voltage (e.g., ground, $V_{GND}$) to a voltage source (e.g., $V_{DD}$) to the voltage source to a second voltage source (e.g., $V_{DD2}$). In some embodiments, the second voltage source may have a voltage magnitude twice that of the voltage source. The inverter chain 504 may provide a voltage $V_P$ to drive a PMOS transistor (see FIG. 7) in the switch 410 in some embodiments. In some embodiments, the inverters 506 after the level shifter 414 in inverter chain 504 may be placed in deep N-wells. This may allow operation from the shifted supply rails in some applications. The other inverter chain 502 may operate between the reference voltage $V_{GND}$ and the voltage source $V_{DD}$ in some embodiments. The inverter chain 502 may provide a voltage $V_N$ to drive an NMOS transistor (see FIG. 7) in the switch 410 in some embodiments.

Figure 6:
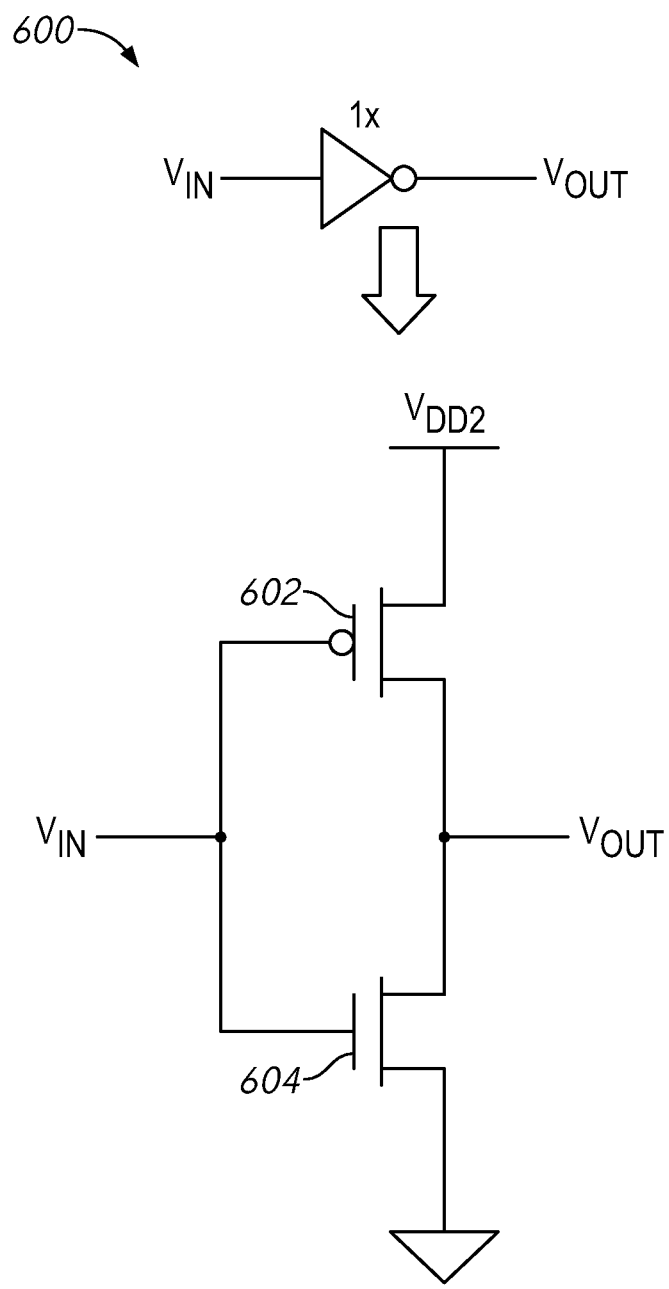
FIG. 6 is a circuit diagram of a unit cell inverter of the SAMP-SCPA shown in FIG. 4.

In some embodiments, the inverter chains 502, 504 may include a cascade of buffer inverters based upon a unit inverter. FIG. 6 is a circuit diagram of a unit inverter 600 of the SAMP-SCPA shown in FIG. 4. The unit inverter 600 may provide a basis for the inverters 506 of the inverter chains 502, 504. That is, the scaling factors shown in FIG. 5 may be based upon the features of the unit inverter 600. The unit inverter 600 includes a PMOS transistor 602 and an NMOS transistor 604 coupled between a voltage source and a reference voltage. The gates of the PMOS transistor 602 and NMOS transistor 604 may be biased by an input voltage $V_{in}$ and an output voltage $V_{out}$ may be provided at a node between the PMOS transistor 602 and the NMOS transistor 604. In the example shown in FIG. 6, the channel width of the PMOS transistor 602 is 1.32 µm and the channel width of the NMOS transistor 604 is 0.55 µm. However, these are provided merely as an example and the present disclosure is not limited to these dimensions.

Figure 7:
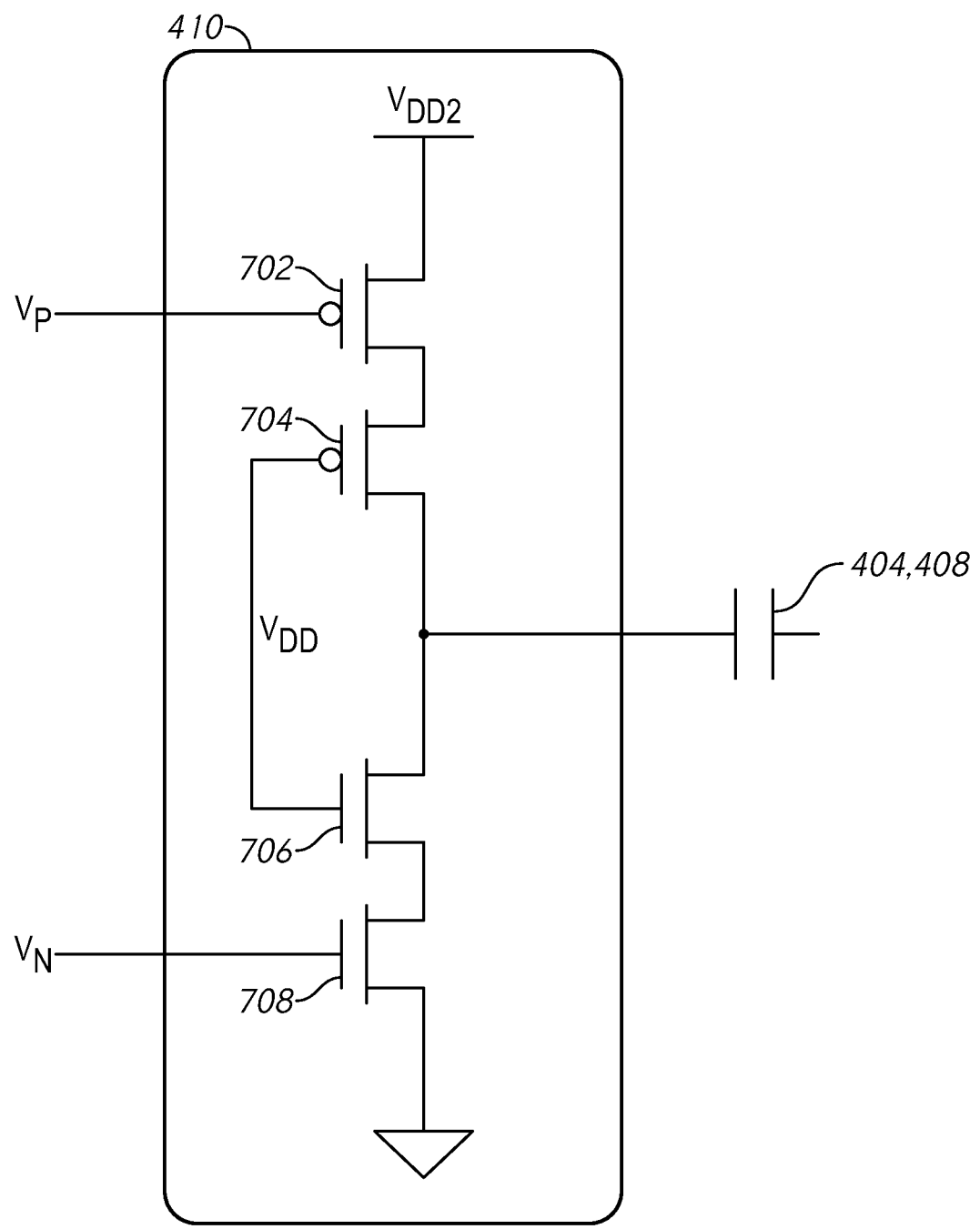
FIG. 7 is a circuit diagram of an output switch and capacitor used in the SAMP-SCPA shown in FIG. 4.

FIG. 7 is a circuit diagram of an output switch 410 and capacitor used in the SAMP-SCPA shown in FIG. 4. In some embodiments, such as the one shown in FIG. 7, the switch 410 may include two PMOS transistors 702 and 704 and two NMOS transistors 706 and 708. The gate of the PMOS transistor 702 may receive a voltage $V_P$ from the driver chain 412 and the gate of the NMOS transistor 708 may receive a voltage $V_N$ from the driver chain 412. In some embodiments, the switch 410 may be a cascoded CMOS inverter. This may provide a larger optimum termination impedance which may intern allow for reduced loss in the output matching network 450 in some applications. The gates of the PMOS transistor 704 and NMOS transistor 706 may be biased to a voltage source (e.g., $V_{DD}$) in some embodiments. The PMOS transistor 704 and NMOS transistor 706 may be coupled to form an inverter that provides an output voltage to the capacitor 404, 408. This topology may allow each transistor to maintain a voltage magnitude no more than $V_{DD}$ across any two terminals.

The switch widths may be selected to drive the capacitor 404, 408 with an optimized power/delay product. In the example shown in FIG. 7, the channel widths of the PMOS transistors 702, 704 are 234 µm, the channel widths of the NMOS transistors 706, 708 are 77 µm, and the capacitance of the capacitor 404, 408 is 356 fF. However, these are provided merely as an example and the present disclosure is not limited to these dimensions.

Figures 8A, 8B:
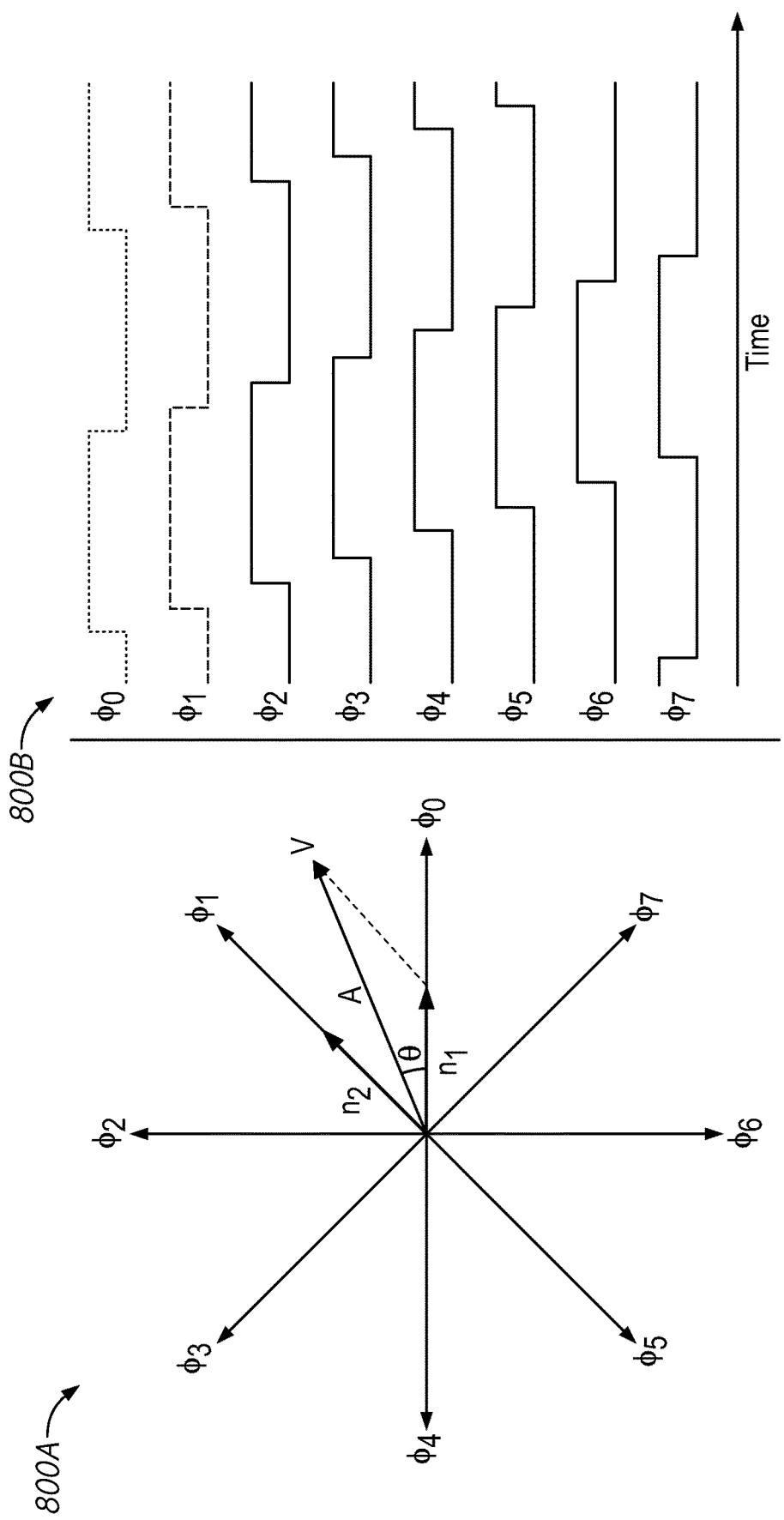
FIG. 8A is an example of multiphase vector addition for eight basis phase vectors in the complex plane according to embodiments of the disclosure.
FIG. 8B are the associated time domain waveforms of the basis phase vectors shown in FIG. 8A.

FIG. 8A is an example of multiphase vector addition for eight basis phase vectors in the complex plane 800A according to embodiments of the disclosure. FIG. 8B are the associated time domain waveforms 800B of the basis phase vectors shown in FIG. 8A. In the example shown in FIGS. 8A and 8B, the complex plane 800A is divided into M=8 basis phases ($\phi_0$-$\phi_7$). However, in other examples, more or fewer basis phases may be used (e.g., 4, 16). In the example, the approach to generate a vector v with amplitude, A, and phase, θ, is depicted. The desired vector v may be provided by an envelope code and/or phase selection code in some embodiments. First, based on the desired phase θ, the two adjacent basis phases of the clock, $\phi_0$ and $\phi_1$, are selected, then they are individually weighted by basis phase weights, $n_1$ and $n_2$ to achieve the desired amplitude A. The basis phase weights $n_1$ and $n_2$ may be found by mapping to Cartesian basis vectors, according to the following equations:

$$n_1 = \frac{I\sin\left(\frac{2\pi(m+1)}{M}\right) - Q\cos\left(\frac{2\pi(m+1)}{M}\right)}{\sin\left(\frac{2\pi}{M}\right)} \quad \text{Equation (1)}$$

$$n_2 = \frac{-I\sin\left(\frac{2\pi m}{M}\right) + Q\cos\left(\frac{2\pi m}{M}\right)}{\sin\left(\frac{2\pi}{M}\right)} \quad \text{Equation (2)}$$

Where m is a phase of M phases. The weights $n_1$ and $n_2$ from the vector addition described above may be used to control the output of a power amplifier, such as a SCPA (e.g., SCPA 400).

Figure 9:
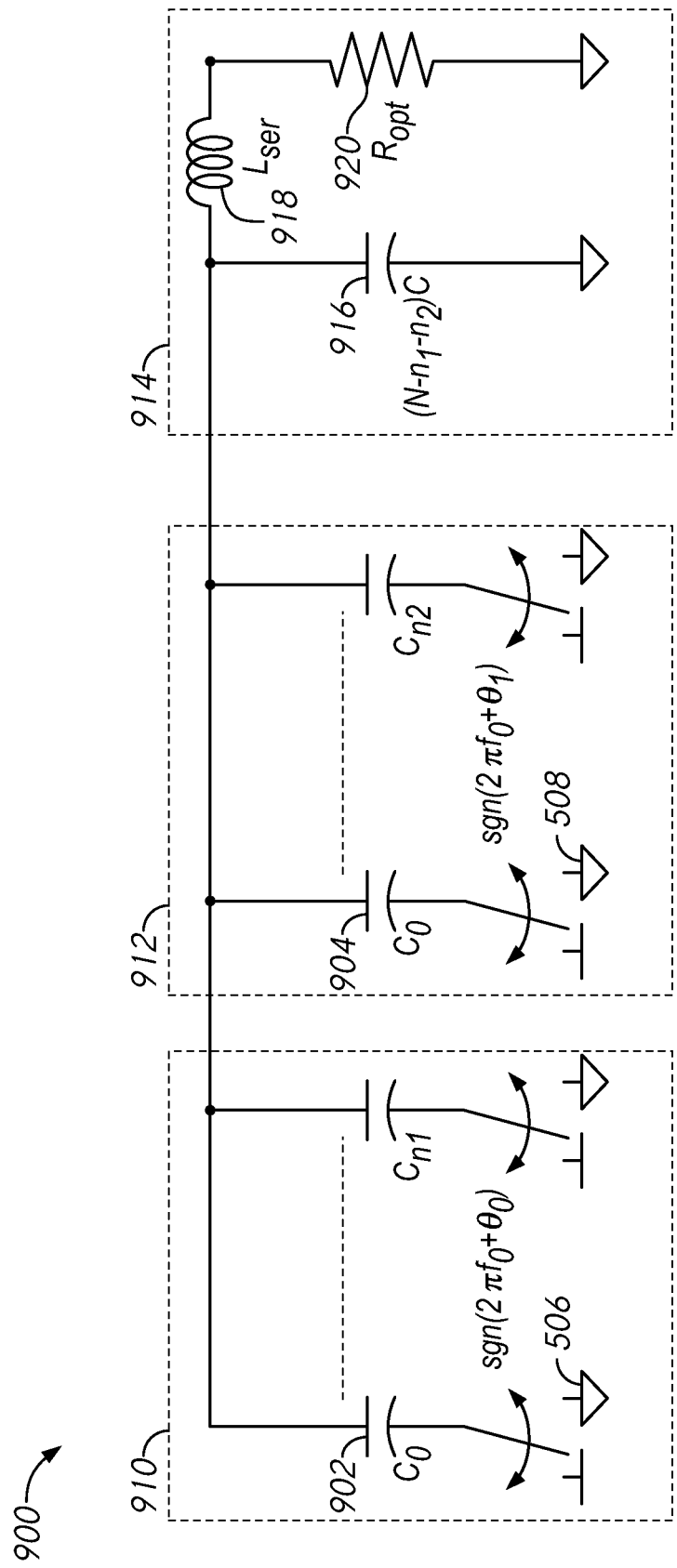
FIG. 9 is circuit diagram of a portion of a multiphase switched-capacitor power amplifier (MP-SCPA) according to embodiments of the present disclosure.

FIG. 9 is circuit diagram of a portion of a multiphase switched-capacitor power amplifier (MP-SCPA) 900 according to embodiments of the present disclosure. In some embodiments, the MP-SCPA 900 may be included in MP-SCPA 106, block 214, SAMP-SCPA 304, and/or SAMP-SCPA 400. The weight $n_1$ controls how many of the capacitors 902 in capacitor array 910 switched on $\phi_0$ and $n_2$ controls how many of the capacitors 904 in capacitor array 912 are switched on $\phi_1$. In some embodiments, the sum of $n_1$ and $n_2$ may be bound by:

$$0 \leq n_1 + n_2 \leq 2^k \quad \text{Equation (3)}$$

Where k represents the total number of bits in the capacitor arrays 910, 912 (e.g., $2^k$, N). Weights $n_1$ and $n_2$ may be found in terms of A and θ using the following substitutions for I and Q:

$$I = A \cos(\theta) \quad \text{Equations (4)}$$

$$Q = A \sin(\theta) \quad \text{Equation (5)}$$

Substitution of Equations 4 and 5 into Equations 1 and 2 yields:

$$n_1 = \frac{A \cdot \cos\left(\frac{\pi}{M}\right) \cdot \sin\left(\frac{2\pi(m-1)}{M} - \theta\right)}{\sin\left(\frac{2\pi}{M}\right)} \quad \text{Equation (6)}$$

$$n_2 = \frac{A \cdot \cos\left(\frac{\pi}{M}\right) \cdot \sin\left(\theta - \frac{2\pi(m-1)}{M}\right)}{\sin\left(\frac{2\pi}{M}\right)} \quad \text{Equation (7)}$$

The voltage amplitude, $V_{out}$, of the output voltage across a load 920 for a given supply voltage, $V_{DD}$, and set of codes and basis phases may be provided by:

$$V_{out} = \frac{2V_{DD}}{\pi} \frac{\sqrt{n_1^2 + n_2^2 + 2n_1 n_2 \cos\left(\frac{2\pi}{M}\right)}}{N} \quad \text{Equation (8)}$$

Where $N = 2^k$.
The output power, $P_{out}$, is given by:

$$P_{out} = \frac{2}{\pi^2} \left(\frac{n_1^2 + n_2^2 + 2n_1 n_2 \cos\left(\frac{2\pi}{M}\right)}{N^2}\right) \frac{V_{DD}^2}{R_{opt}} \quad \text{Equation (9)}$$

Where $R_{opt}$ is the resistance of the load 920.
The input power, $P_{in}$, is the power required to switch the total input capacitance (e.g., by switches 906 and/or switches 908) is provided by:

$$P_{in} = C_{in} V_{DD}^2 f_0 \quad \text{Equation (10)}$$

Where $f_0$ is the output frequency and $C_{in}$ is the total input capacitance. $C_{in}$ is given by the equation:

$$C_{in} = \left[\frac{(n_1)(N - n_1)}{N^2} + \frac{(n_2)(N - n_2)}{N^2} + \frac{2n_1 n_2}{N^2}\right] C \quad \text{Equation (11)}$$

Where C is the value of a unit (e.g., single) capacitor in the capacitor arrays 910, 912.

In some embodiments, the total capacitance of the arrays 910, 912 may be selected to optimize matching (e.g., by utilizing larger unit capacitors) and/or efficiency at backoff by controlling the network quality factor $Q_{NW}$. In some embodiments, split-array techniques may allow a tradeoff between matching and efficiency.

In some embodiments, the SCPA may be a series resonant circuit that includes bandpass network 914, which may include a capacitor 916, a series resonant inductor 918, and/or load 920, where $Q_{NW}$ may be provided by:

$$Q_{NW} = \frac{1}{2\pi NCR_{opt}} \quad \text{Equation (12)}$$

The inductance, $L_{ser}$, of series resonant inductor 918 may be chosen to be resonant with the total capacitance C and may be found using the equation:

$$L_{ser} = \frac{1}{NC(2\pi f_0)^2} \quad \text{Equation (13)}$$

In some embodiments, the series resonant inductor 918 and resistance of load 920 may be replaced with any load and an impedance matching network. The transformation of the impedance matching network may present a net inductive reactance and real impedance designed for the desired power level according to Equation 9.

When the output power $P_{out}$ and input power $P_{in}$ are known, the drain efficiency, may be found according to the following:

$$\eta = \left(1 + \frac{P_{in}}{P_{out}}\right)^{-1} \quad \text{Equation (14)}$$

Substituting Equations 6-12 into Equation 14 yields:

$$\eta = \left\{1 + \frac{\pi[n_1(N - n_1) + n_2(N - n_2)]}{4 \cdot Q_{NW} \cdot \left[n_1^2 + n_2^2 + 2n_1 n_2 \cos\left(\frac{2\pi}{M}\right)\right]}\right\}^{-1} \quad \text{Equation (15)}$$

The efficiency may be found at any output power level and phase angle by selecting $n_1$ and $n_2$ according to Equations 1 and 2. In some embodiments, choosing $Q_{NW}$ to be larger may increase the efficiency level at output power backoff, but in some embodiments, this may be at the expense of output bandwidth.

Operation using split-arrays, such as the SAMP-SCPA 900 shown in FIG. 9, may not change the operation as presented above, but split-arrays may allow the resolution of the SCPA to be arbitrarily controlled while also controlling $Q_{NW}$. Additionally, it is noted that the multiphase technique illustrated in FIGS. 8A and 8B may be used as a constant envelope phase modulator.

In some embodiments, both $n_1$ and $n_2$ are quantized values that may be used to reconstruct arbitrary output amplitude and phase combinations. If the number of available states decreases as the amplitude decreases, the phase resolution for small amplitudes may decrease. This is true for any digital multiphase transmitter, including the special cases of a quadrature digital transmitters. Because the entire array may be switched fully by either $\phi_0$ or $\phi_1$, or a combination of the both, there are $2^{k+1}$ possible states between the basis phases. In some embodiments, increasing the MP-SCPA resolution, k, may increase both the amplitude and phase resolution. Similarly, increasing the number of phases increases both the amplitude and phase resolution, particularly for low output amplitudes, as the density of states in each cone between two adjacent phases increases as the number of basis phases, M, increases.

In some embodiments, as the number of phases is increased, the discrete number of amplitude/phase states covers a reduced amount of area, meaning that the root mean squared (RMS) error of the phase interpolation for θ (See FIG. 8A) may be reduced. For example, when doubling the number of phases, the same RMS phase error may be achieved for 3 dB less power. In some embodiments, increasing the number of phases may not have a significant impact on the RMS amplitude error at large amplitudes, A (see FIG. 8A), but the increased density of states may have some impact at lower amplitudes.

For MP-SCPAs, in some embodiments, as M is increased, the average power drop relative to a polar system may be reduced. However, in some embodiments, this may be at the expense of reduced time available for charge settling, which may reduce linearity in some applications. In some embodiments, M=16 may provide an adequate tradeoff between the power drop, efficiency and linearity. In some embodiments, RMS amplitude errors may also be based, at least in part, on a resolution of the SCPA capacitor array. In some embodiments, increasing the array resolution may reduce the RMS amplitude error by ≈6 dB per bit of resolution.

Figure 10:
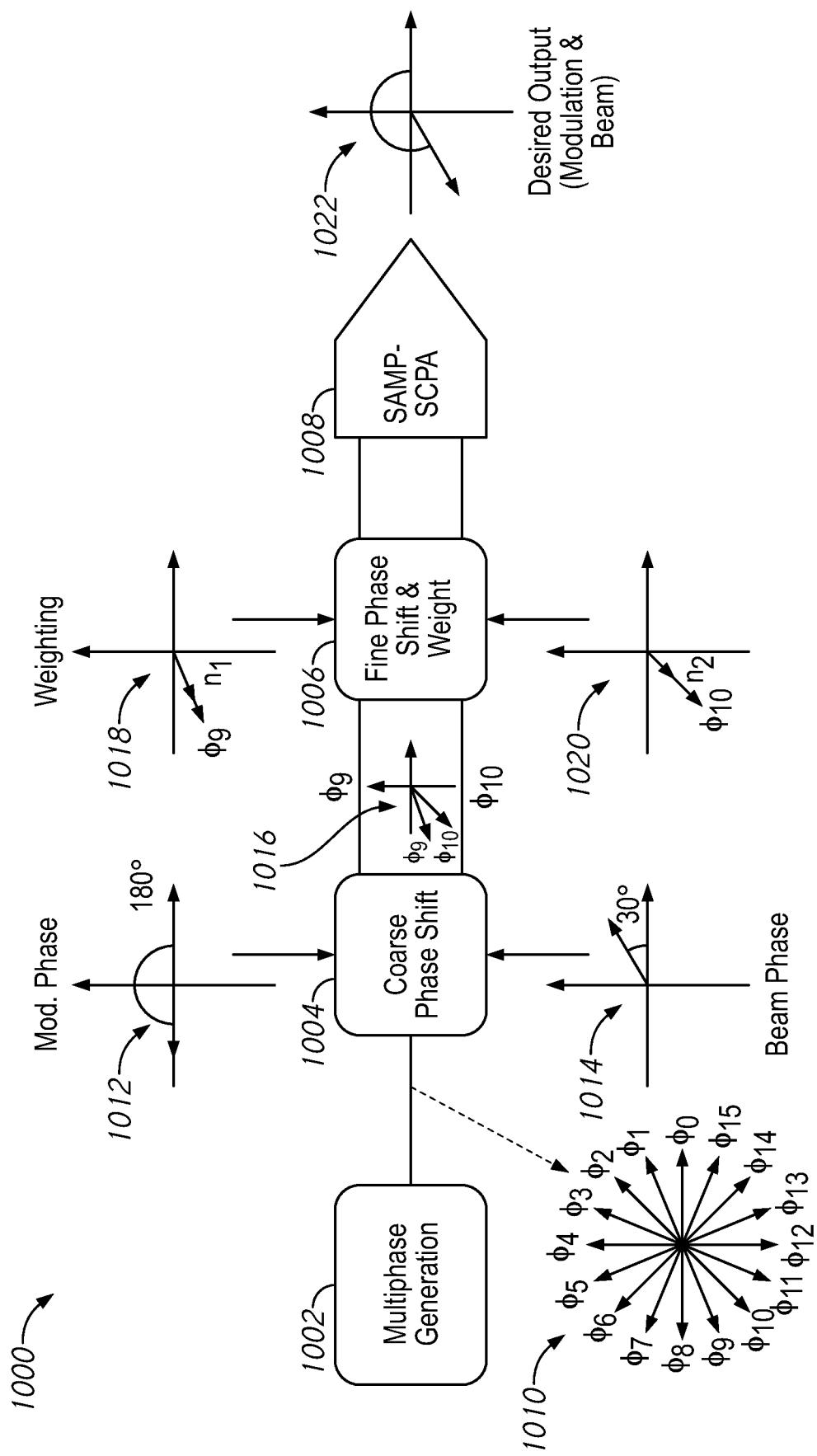
FIG. 10 is a schematic of a technique for multiphase interpolation beamforming using a MP-SCPA.

FIG. 10 is a schematic of a technique 1000 for multiphase interpolation beamforming using a MP-SCPA. The technique 1000 may be performed by the multi-element beamforming transmitter 200, and/or the multi-element beamforming transmitter 300 in some embodiments.

First, at block 1002, a set of basis phases (e.g., φ0-φ15) that span the unit circle 1010 may be generated by a multiphase clock generator (e.g., multiphase clock generator 102, multiphase clock generator 210, phase injection locked ring oscillator 308). Next, at block 1004, a desired instantaneous modulation phase 1012 and a desired beam phase 1014 are added as inputs into a multiphase logic decoder (e.g., multiphase logic decoder 104, multiphase logic decoder 204, multiphase logic decoder 306). In some embodiments, these may be provided by an envelope code and/or a phase code. For illustration, an example modulation phase of 180° and an example beam phase of 30° are shown. The multiphase logic decoder may determine the total desired phase shift (210°) and may select two adjacent phases (e.g., $\phi_A$=202.5° and $\phi_B$=225° using the example inputs 1012, 1014) from the set of basis phases to this desired output phase as shown in plot 1016. The operation performed at block 1004 may be a coarse phase shift.

The desired amplitude of the output shown in plot 1016 is may be provided as an input to block 1006 where the input is used as a product of the instantaneous modulation envelope and a desired beam weighting. From this, the multiphase logic decoder may determine the $n_1$ and $n_2$, the required weighting for $\phi_A$ and $\phi_B$, respectively, as shown in plots 1018 and 1020. The technique for determining $n_1$ and $n_2$ may be the technique discussed with reference to FIGS. 8-9. Finally, at block 1008, the weights $n_1$ and $n_2$ may be applied to a SAMP-SCPA (e.g., multiphase SCPA 106, multiphase SCPA 206, SAMP-SCPA core 304), which may determine how many of the cells are switched on $\phi_A$, how many are switched on $\phi_B$ and/or how many are held at ground. In this way, the weighted basis phases are added on the SAMP-SCPA capacitor array to form a vector summation that contains the desired output amplitude and phase modulation, as well as the desired beam-steering and weighting as shown in plot 1022.

The technique 1000 may allow for the amplitude and phase weighting to occur at the SAMP-SCPA. In some embodiments, the weighting may be completely controlled by an individual multiphase logic decoder which may save power and/or area in some applications. The technique 1000 may allow direct recombination at the output stage.

In choosing a designed resolution of a transmitter according to embodiments of the present disclosure, it is noted that the phase and amplitude control for the beam steering may be added as offsets using a digital encoder. The resolution required for wideband wireless communication to suppress out-of-band noise and achieve in-band high fidelity (e.g., low EVM and ACLR) may be higher than that required to achieve high phase and amplitude resolution for beam steering in some applications. Hence, capacitor array resolution may be primarily dictated by the in-band and out-of-band signal requirements of the communication signal to be transmitted in some applications.

The beamforming transmitters disclosed herein may be implemented in 65 nm CMOS. In some embodiments, the beamformers disclosed herein leverage multiphase interpolation to enable beamsteering and beamweighting without the need for external phase shifters or individual DACs for each element. The techniques disclosed herein may leverage any DPA to act as a weighting element at least because DPAs are bandpass transmitters that simultaneously enable frequency translation, data conversion, and/or can operate with large effective gain in a small die area in some applications. In some applications, in bandpass DPAs, the output reconstruction filter may be a bandpass filter that is often smaller than the low-pass baseband filter that are used in conventional up-converting transmitters. An SCPA is used in DPAs of the present disclosure, which may allow simultaneous high linearity, power efficiency, system efficiency, and/or small die area.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a multiphase clock generator configured to provide a plurality of base phases, based at least in part, on a clock signal;
   a multiphase logic decoder configured to receive the plurality of base phases, a first signal, and a second signal, wherein the first signal includes envelope modulation and beam weighting information and the second signal includes phase information, wherein the multiphase logic decoder is further configured to:
  select a first phase and a second phase from the plurality of base phases based, at least in part, on the second signal; and
  perform a vector addition based, at least in part, on the first phase, the second phase, the first signal and the second signal to generate an amplitude signal; and
a power amplifier configured to provide an output signal, wherein the output signal is based, at least in part, on the first phase, the second phase, and the amplitude signal.

2. The apparatus of claim 1, wherein the multiphase clock generator includes a phase injection locked ring oscillator.

3. The apparatus of claim 1, further comprising a matching network coupled to the power amplifier.

4. The apparatus of claim 1, wherein the power amplifier is a switched capacitor power amplifier (SCPA).

5. The apparatus of claim 4, wherein the SCPA includes a capacitor array, wherein the capacitor array includes a unary portion and a C-2C portion.

6. The apparatus of claim 4, wherein the SCPA includes a plurality of capacitors, individual ones of the plurality of capacitors selectively activated by one of a corresponding plurality of switches, wherein the plurality of switches are controlled, at least in part, by the amplitude signal, the first phase, and the second phase provided by the multiphase logic decoder.

7. The apparatus of claim 6, wherein individual ones of the plurality of switches include a cascoded inverter.

8. A system comprising:
a plurality of transmitters, each of the plurality of transmitters comprising:
  a multiphase logic decoder configured to receive a plurality of base phases, a an envelope signal, and a phase signal, wherein the multiphase logic decoder is further configured to:
    provide a first phase and a second phase from the plurality of base phases based, at least in part, on the phase signal; and
    provide an amplitude based at least in part, on decoding the envelope signal and the phase signal using the first phase and the second phase; and
  a power amplifier configured to provide an output signal, wherein the output signal is based, at least in part, on the first phase, the second phase, and the amplitude.

9. The system of claim 8, wherein the plurality of transmitters includes four transmitters.

10. The system of claim 8, wherein the multiphase logic decoder of each of the plurality of transmitters is further configured to receive a control signal, wherein the control signal enables and disables separate beamweighting and modulation for individual ones of the plurality of transmitters.

11. The system of claim 8, wherein each of the plurality of transmitters further comprises a multiphase clock generator configured to provide the plurality of base phases.

12. The system of claim 11, further comprising a global clock configured to provide a clock signal to each of the plurality of transmitters, wherein the plurality of base phases are generated, based at least in part, on the clock signal.

13. The system of claim 8, wherein the power amplifier is a switched capacitor power amplifier (SCPA).

14. The system of claim 13, wherein the SCPA includes a plurality of capacitors, individual ones of the plurality of capacitors selectively activated and deactivated based, at least in part, on the amplitude, the first phase, and the second phase provided by the multiphase logic decoder.

15. The system of claim 8, further comprising a matching network coupled to the power amplifier, wherein the matching network is configured to be series resonant with the power amplifier.

16. The system of claim 15, wherein the matching network includes a bandpass network.

17. A method comprising:
  generating a plurality of base phases;
  determining a total phase shift based at least in part, on a modulation phase and a beam phase;
  selecting a first phase adjacent to the total phase shift and a second phase adjacent to the total phase shift from the plurality of base phases;
  determining a first weight for the first phase and a second weight for the second phase based, at least in part, on a desired beam weighting; and
  encoding the first weight and the second weight as an amplitude signal.

18. The method of claim 17, further comprising: providing the first phase, the second phase, and the amplitude signal to a power amplifier to control an output signal of the power amplifier.

19. The method of claim 17, wherein the plurality of base phases includes sixteen phases.

20. The method of claim 18, wherein determining the first weight and the second weight comprises performing a vector addition.

* * * * *